US009734990B2

United States Patent
Chang et al.

(10) Patent No.: US 9,734,990 B2
(45) Date of Patent: Aug. 15, 2017

(54) PLASMA APPARATUS AND SUBSTRATE-PROCESSING APPARATUS

(71) Applicants: KOREA ADVANCED INSTITUTE OF SCIENCE AND TECHNOLOGY, Daejeon (KR); WINTEL CO., LTD, Gyeonggi-do (KR)

(72) Inventors: Hong-Young Chang, Daejeon (KR); Jin-Won Lee, Daejeon (KR)

(73) Assignee: KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 445 days.

(21) Appl. No.: 14/251,013

(22) Filed: Apr. 11, 2014

(65) Prior Publication Data

US 2014/0292193 A1    Oct. 2, 2014

Related U.S. Application Data

(63) Continuation of application No. PCT/KR2012/007977, filed on Oct. 2, 2012.

(30) Foreign Application Priority Data

Oct. 13, 2011    (KR) .................. 10-2011-0104792

(51) Int. Cl.
  H01J 37/32    (2006.01)
  H05H 1/46    (2006.01)
(52) U.S. Cl.
  CPC ..... *H01J 37/3211* (2013.01); *H01J 37/32165* (2013.01); *H05H 1/46* (2013.01);
  (Continued)
(58) Field of Classification Search
  None
  See application file for complete search history.

(56) References Cited

U.S. PATENT DOCUMENTS

| | | | |
|---|---|---|---|
| 3,979,624 A | | 9/1976 | Liu et al. |
| 5,114,770 A | * | 5/1992 | Echizen .............. C23C 16/50 136/258 |

(Continued)

FOREIGN PATENT DOCUMENTS

| | | |
|---|---|---|
| CN | 1293608 C | 1/2007 |
| CN | 100567567 C | 12/2009 |

(Continued)

OTHER PUBLICATIONS

International Search Report for Application No. PCT/US 01/09199 dated Oct. 10, 2001.

(Continued)

*Primary Examiner* — Douglas W Owens
*Assistant Examiner* — Srinivas Sathiraju
(74) *Attorney, Agent, or Firm* — Jenkins, Wilson, Taylor & Hunt P.A.

(57) ABSTRACT

Provided are a plasma generating apparatus and a substrate processing apparatus. The plasma generating apparatus includes a plurality of dielectric tubes mounted in a plurality of through-holes formed in a vacuum container, respectively; antennas comprising or divided into a first group of antennas and a second group of antennas based on their disposition symmetry in the vacuum container and mounted outside the dielectric tubes, respectively; a first RF power source to supply power to the first group of antennas; a second RF power source to supply power to the second group of antennas; and a first power distribution unit disposed between the first group of antennas and the first RF power source to distribute the power from the first RF power source to the first group of antennas.

10 Claims, 10 Drawing Sheets

(52) U.S. Cl.
CPC  *H01J 2237/327* (2013.01); *H05H 2001/4667* (2013.01)

(56) References Cited

U.S. PATENT DOCUMENTS

| | | | |
|---|---|---|---|
| 5,227,698 A | 7/1993 | Simpson et al. | |
| 5,330,578 A | 7/1994 | Sakama et al. | |
| 5,404,076 A | 4/1995 | Dolan et al. | |
| 5,479,072 A | 12/1995 | Dakin et al. | |
| 5,556,549 A | 9/1996 | Bose et al. | |
| 5,565,074 A | 10/1996 | Sato et al. | |
| 5,594,303 A | 1/1997 | Simpson et al. | |
| 5,653,811 A * | 8/1997 | Chan | H01J 37/20 118/723 I |
| 5,688,064 A | 11/1997 | Shanks | |
| 5,733,511 A | 3/1998 | De Francesco | |
| 5,846,883 A | 12/1998 | Moslehi | |
| 6,049,086 A | 4/2000 | Foggiato et al. | |
| 6,074,512 A | 6/2000 | Collins et al. | |
| 6,189,484 B1 * | 2/2001 | Yin | H01J 37/321 118/723 I |
| 6,259,209 B1 | 7/2001 | Bhardwaj et al. | |
| 6,351,075 B1 * | 2/2002 | Barankova | H01J 37/3266 118/723 MA |
| 6,352,049 B1 | 3/2002 | Yin et al. | |
| 6,353,201 B1 | 3/2002 | Yamakoshi | |
| 6,451,161 B1 * | 9/2002 | Jeng | H01J 37/321 118/723 I |
| 6,551,447 B1 * | 4/2003 | Savas | H01J 37/321 118/723 I |
| 6,685,798 B1 * | 2/2004 | Holland | H01J 37/321 118/723 AN |
| 6,792,889 B2 | 9/2004 | Nakano et al. | |
| 6,873,119 B2 | 3/2005 | Kim | |
| 7,090,705 B2 | 8/2006 | Miyazaki et al. | |
| 7,163,877 B2 | 1/2007 | Niimi et al. | |
| 7,183,716 B2 * | 2/2007 | Kanarov | H01J 27/18 118/723 I |
| 7,453,191 B1 * | 11/2008 | Song | H01J 37/32357 313/231.31 |
| 7,646,608 B2 * | 1/2010 | Thompson | H01L 23/433 165/185 |
| 7,767,561 B2 * | 8/2010 | Hanawa | C23C 14/48 257/E21.057 |
| 7,819,081 B2 | 10/2010 | Kawasaki et al. | |
| 7,845,310 B2 * | 12/2010 | DiVergilio | H01J 37/321 118/723 AN |
| 7,854,213 B2 * | 12/2010 | Brcka | H01J 37/321 118/723 I |
| 7,863,582 B2 * | 1/2011 | Godyak | H01J 27/18 250/423 F |
| 7,886,690 B2 | 2/2011 | Ellingboe | |
| 7,952,048 B2 | 5/2011 | Choi et al. | |
| 8,018,163 B2 | 9/2011 | Wi | |
| 8,128,884 B2 | 3/2012 | Min et al. | |
| 8,152,954 B2 * | 4/2012 | Bettencourt | C23C 16/4401 156/345.33 |
| 8,169,148 B2 | 5/2012 | Jeon et al. | |
| 8,444,870 B2 * | 5/2013 | Godyak | H01J 37/321 118/723 I |
| 8,636,871 B2 | 1/2014 | Sawada et al. | |
| 8,835,869 B2 * | 9/2014 | Yevtukhov | H01J 27/18 250/396 ML |
| 8,900,402 B2 | 12/2014 | Holland et al. | |
| 8,992,725 B2 * | 3/2015 | Godyak | H01J 37/321 118/723 AN |
| 8,994,270 B2 * | 3/2015 | Koo | H01J 37/32366 315/111.11 |
| 9,066,413 B2 | 6/2015 | Chang et al. | |
| 9,082,590 B2 * | 7/2015 | Carducci | H05H 1/46 |
| 9,281,176 B2 | 3/2016 | Kim et al. | |
| 2001/0002584 A1 * | 6/2001 | Liu | C23C 14/48 118/723 I |
| 2003/0015965 A1 * | 1/2003 | Godyak | H01J 37/32009 315/111.21 |
| 2004/0239261 A1 | 12/2004 | Kim et al. | |
| 2005/0001556 A1 | 1/2005 | Hoffman et al. | |
| 2005/0255255 A1 | 11/2005 | Kawamura et al. | |
| 2007/0119828 A1 | 5/2007 | Kondo et al. | |
| 2007/0193513 A1 | 8/2007 | Deguchi | |
| 2008/0050292 A1 * | 2/2008 | Godyak | H01J 37/321 422/186.29 |
| 2009/0102385 A1 | 4/2009 | Wi | |
| 2009/0233385 A1 | 9/2009 | Okumura et al. | |
| 2009/0255630 A1 | 10/2009 | Toyoda et al. | |
| 2009/0255639 A1 | 10/2009 | Wang | |
| 2010/0006543 A1 | 1/2010 | Sawada et al. | |
| 2010/0015357 A1 | 1/2010 | Hanawa et al. | |
| 2010/0024729 A1 | 2/2010 | Cao et al. | |
| 2010/0095888 A1 | 4/2010 | Mori et al. | |
| 2012/0031559 A1 * | 2/2012 | Dhindsa | H01J 37/32091 156/345.26 |
| 2012/0289053 A1 | 11/2012 | Holland et al. | |
| 2013/0255575 A1 | 10/2013 | Chang | |
| 2014/0077700 A1 * | 3/2014 | Chang | H01J 37/321 315/111.51 |
| 2014/0130980 A1 | 5/2014 | Lee | |
| 2014/0292193 A1 * | 10/2014 | Chang | H01J 37/32165 315/34 |
| 2014/0320016 A1 | 10/2014 | Chang | |
| 2014/0360670 A1 * | 12/2014 | Chen | H01J 37/32357 156/345.29 |
| 2014/0370715 A1 | 12/2014 | Chung | |
| 2015/0155155 A1 | 6/2015 | Kim et al. | |

FOREIGN PATENT DOCUMENTS

| | | |
|---|---|---|
| CN | 101 800 161 | 8/2010 |
| CN | 101194338 B | 9/2010 |
| CN | 101 805 895 B | 9/2011 |
| CN | 101601125 B | 7/2012 |
| CN | 101534930 B | 2/2013 |
| CN | 101420816 B | 5/2014 |
| EP | 2120514 B1 | 6/2012 |
| JP | 06-122983 | 5/1994 |
| JP | 08-008096 | 1/1996 |
| JP | 09-192479 | 7/1997 |
| JP | H11-154600 A | 6/1999 |
| JP | 2000-277506 A | 10/2000 |
| JP | 2000/277599 A | 10/2000 |
| JP | 2002/025919 | 1/2002 |
| JP | 2003/529216 A | 9/2003 |
| JP | 2005/259836 | 9/2005 |
| JP | 2006/310883 A | 11/2006 |
| JP | 2008/181737 A | 8/2008 |
| JP | 2010/132950 | 6/2010 |
| JP | 4601104 B2 | 10/2010 |
| KR | 10-2001/0040736 A | 5/2001 |
| KR | 10-2001/0093439 | 10/2001 |
| KR | 10-2004/0034758 A | 4/2004 |
| KR | 10-2005/0092277 | 9/2005 |
| KR | 10-2005-0110548 A | 11/2005 |
| KR | 10-2007/0062708 | 6/2007 |
| KR | 10-0761687 N1 | 9/2007 |
| KR | 10-2008/0061814 A | 7/2008 |
| KR | 10 2008 0068974 A | 7/2008 |
| KR | 10-2009-0005542 A | 1/2009 |
| KR | 10-2009/0125406 A | 7/2009 |
| KR | 10-2009/0108730 | 10/2009 |
| KR | 10-2010/0002290 A | 6/2010 |
| KR | 10-2010/0066994 | 6/2010 |
| KR | 10-2010/0087266 A | 8/2010 |
| KR | 10-2011/0025328 A | 10/2011 |
| KR | 10-1362891 B1 | 2/2014 |
| TW | 399 396 B | 7/2000 |
| TW | 462 207 | 11/2001 |
| TW | 200850082 | 12/2008 |
| WO | WO-92-08240 | 5/1992 |
| WO | WO-93-21655 | 10/1993 |
| WO | WO-94-08439 | 4/1994 |
| WO | WO-95-10848 | 4/1995 |

(56) References Cited

FOREIGN PATENT DOCUMENTS

| WO | WO-96-28840 | 9/1996 |
|---|---|---|
| WO | WO-96-33509 | 10/1996 |
| WO | WO-97-02589 A | 1/1997 |
| WO | WO-97-27609 | 7/1997 |
| WO | WO-98-53474 A2 | 11/1998 |
| WO | WO 2007/002455 A2 | 1/2007 |
| WO | WO-2012/077843 A1 | 6/2012 |
| WO | WO-2012/157844 | 11/2012 |
| WO | WO-2013/018998 | 2/2013 |
| WO | WO 2013/055056 A1 | 4/2013 |
| WO | WO-2014/003333 A1 | 1/2014 |

OTHER PUBLICATIONS

International Search Report for PCT/KR2010/008798 dated Aug. 22, 2011.
International Search Report for Application No. PCT/KR2012/002179 dated Oct. 4, 2012.
International Search Report for Application No. PCT/KR2012/005525 dated Jan. 3, 2013.
International Search Report for Application No. PCT/KR 2013/005072 dated Sep. 17, 2013.
Non-Final Office Action for U.S. Appl. No. 14/082,795 dated Oct. 24, 2014.
Notice of Allowance for U.S. Appl. No. 14/082,795 dated Feb. 20, 2015.
Chinese Office Action for Application No. CN 2010-80070565.7 dated Mar. 25, 2015.
Restriction Requirement for U.S. Appl. No. 14/472,781 dated Aug. 14, 2015.
Francis F Chen and Humberto Torreblanca, "Large-area helicon plasma source with permanent magnets", Plasma Physics and Controlled Fusion, vol. 49, A81-A93, Mar. 27, 2007.
International Search Report for Application No. PCT/KR2012/007977 dated Mar. 4, 2013.
Notice of Allowance for U.S. Appl. No. 14/574,745 dated Oct. 14, 2015.
Chinese Office Action for Application No. 2012 80047361.0 dated Nov. 23, 2015.
Plasma Pyhs. Control. Fusion, Francis F Chen, Large-area helicon plasma source with permanent magnets.
Notice of Allowance for U.S. Appl. No. 14/574,745 dated Dec. 10, 2015.
Restriction Requirement for U.S. Appl. No. 14/328,867 dated Jan. 5, 2016.
Non-Final Office Action for U.S. Appl. No. 14/472,781 dated Jan. 29, 2016.
Restriction Requirement for U.S. Appl. No. 13/905,872 dated Apr. 29, 2016.
Chinese Office Action for Application No. CN 201380008244.8 dated Apr. 5, 2016.
Final Office Action for U.S. Appl. No. 14/472,781 dated Aug. 1, 2016.
Advisory Action for U.S. Appl. No. 14/472,781 dated Oct. 21, 2016.
Restriction Requirement for U.S. Appl. No. 14/160,117 dated Nov. 9, 2016.
Non-Final Office Action for U.S. Appl. No. 14/472,781 dated Nov. 22, 2016.
Interview Summary for U.S. Appl. No. 14/472,781 dated Dec. 13, 2016.
Non-Final Office Action for U.S. Appl. No. 13/905,872 dated Jan. 13, 2017.

* cited by examiner

PLASMA APPARATUS AND SUBSTRATE-PROCESSING APPARATUS

CROSS-REFERENCE TO RELATED APPLICATIONS

This application is a continuation of and claims priority to PCT/KR2012/007977 filed on Oct. 2, 2012, which claims priority to Korea Patent Application No. 10-2011-0104792 filed on Oct. 13, 2011, both of which are incorporated by reference herein.

BACKGROUND

1. Field of the Invention

The present invention described herein generally relates to plasma generating apparatuses and, more particularly, inductively coupled plasma generating apparatuses.

2. Description of the Related Art

A large-area plasma generating apparatuses includes an inductively coupled plasma generating apparatus, a capacitively coupled plasma generating apparatus or a helicon plasma generating apparatus.

SUMMARY

Embodiments of the present invention provide a plasma generating apparatus for generating uniform helicon or inductively coupled plasma.

A plasma generating apparatus according to an embodiment of the present invention may include a plurality of dielectric tubes mounted in a plurality of through-holes formed in a vacuum container, respectively; antennas divided into a first group of antennas and a second group of antenna based on their disposition symmetry in the vacuum container and mounted outside the dielectric tubes, respectively; a first RF power source to supply power to the first group of antennas; a second RF power source to supply power to the second group of antennas; and a first power distribution unit disposed between the first group of antennas and the first RF power source to distribute the power from the first RF power source to the first group of antennas.

In an embodiment of the present invention, the first power distribution unit may include a first power distribution line; and a first conductive outer cover that covers the first power distribution line and is grounded. A distance between an input terminal of the first power distribution unit and the antenna of the first group may be the same.

In an embodiment of the present invention, the plasma generating apparatus may further include a second power distribution unit disposed between the second RF power source and the antenna of the second group. The second power distribution unit includes a second power distribution line; and a second conductive outer cover that covers the second power distribution line and is grounded. A distance between an input terminal of the second power distribution unit and the antenna of the second group may be the same.

In an embodiment of the present invention, the plasma generating apparatus may further include toroidal permanent magnets disposed to be spaced in a longitudinal direction of the dielectric tubes.

In an embodiment of the present invention, the plasma generating apparatus may further include a moving part to fix all or some of the permanent magnets and to move a plane on which the permanent magnets are disposed.

In an embodiment of the present invention, the moving part may include at least one support pillar fixedly connected to the vacuum container; and perpendicularly extending to a plane on which the dielectric tubes are disposed and a permanent magnet fixing plate, on which the permanent magnets are mounted, inserted into the support pillar to be movable along the support pillar.

In an embodiment of the present invention, antennas of the first group may be symmetrically disposed in the vicinity of the circumference of a constant radius on the basis of the center of a circular top plate of the vacuum container, and the antenna of the second group may be disposed in the center of the top plate In an embodiment of the present invention, the first power distribution unit may include an input branch in the form of coaxial cable, which receives power from the first RF power source; a three-way branch in the form of coaxial cable, which is connected to the input branch and branches into three; and T branches in the form of coaxial cable, which is connected to the three-way branch to branch into two.

In an embodiment of the present invention, the plasma generating apparatus may further include fixing plates fixing the antennas and fixed to the top plate; and a ground line connected to the fixing plate and an outer conductor of the T branches. One end of each of the fixing plates may be connected to one end of each of the antennas, and the other end of the fixing plates may be connected to one end of the ground line. The length of the ground line may be the same with respect to all the antennas.

In an embodiment of the present invention, the plasma generating apparatus may further include metal lids each being mounted on one end of each of the dielectric tubes. The length ($L/2=\pi/k_z$) of each of the dielectric tubes may meet the equation below:

$$k_z^4 + \left(\frac{3.83}{R}\right)^2 k_z^2 - \left(\frac{e\mu_0 n_0 \omega}{B_0}\right)^2 = 0$$

where R represents a radius of each of the dielectric tube, e represents charge amount of electron, $B_0$ represents intensity of magnetic flux density in the center of each of the dielectric tubes, $\mu_0$ represents permeability, $\omega$ represents an angular frequency, and $n_0$ represents plasma density.

In an embodiment of the present invention, a driving frequency of the first RF power source may be different from that of the second RF power source.

In an embodiment of the present invention, the antennas may be arranged on a squared top plate of the vacuum container in a matrix. The antenna of the first group may be disposed along the circumference, and the antenna of the second group may be disposed inside to be surrounded by the antenna of the first group.

In an embodiment of the present invention, the plasma generating apparatus may further include a second power distribution unit disposed between the antenna of the second group and the second RF power source to distribute power from the second RF power source to the antenna of the second group.

A plasma generating apparatus according to another embodiment of the present invention may include a plurality of dielectric tubes mounted in a plurality of through-holes formed at a vacuum container, respectively; antennas divided into a first group and a second group based on their disposition symmetry in the vacuum container and mounted outside the dielectric tubes, respectively; a first RF power source to supply power to an antenna of the first group; a second RF power source to supply power to an antenna of the second group; and a first power distribution unit disposed between the antenna of the first group and the first RF power source to distribute the power from the first RF power source to the antenna of the first group.

In an embodiment of the present invention, the plasma generating apparatus may further include grids disposed at lower portions of the through-holes, respectively.

BRIEF DESCRIPTION OF THE DRAWINGS

The present invention will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the present invention.

DETAILED DESCRIPTION

In order to generate large-area plasma, a single power source may supply power to a plurality of antennas connected in parallel. A power distribution unit may be disposed between the antennas and the power source to supply the same power to the respective antennas.

For example, seven antennas are disposed on a circular top plate of a vacuum container. One antenna is disposed in the center of the circular top plate, and the other antennas may be symmetrically disposed on a predetermined circumference with respect to the center of the circular top plate. The seven antennas may be connected to a single power source through the power distribution unit.

However, if the antennas generate plasma, impedance of antennas with symmetry on the circumference is made different from that of an antenna in the center. Therefore, power may be concentrated on some of the antennas to prevent generation of uniform plasma.

Thus, in a plasma generating apparatus according to an embodiment of the present invention, the antennas are divided into a plurality of antenna groups based on disposition symmetry and the antenna groups may be connected to different power sources to supply independent power between the antenna groups.

In addition, the power distribution unit is in the form of coaxial cable where all antennas in each antenna group have the same length. Accordingly, all the antennas in each antenna group may operate in the same condition.

Conventionally, an inductively coupled plasma generating apparatus generate high-density plasma at tens of milliTorr (mTorr) or higher. However, it is difficult for the inductively coupled plasma generating apparatus to generate high-density plasma at a low pressure of several mTorr. Thus, a low-pressure process and a high-pressure process could not be performed in a single vacuum container.

As integration density of semiconductor devices increases, there is a need for a plasma generating apparatus with high density at a low pressure (several mTorr) which is capable of controlling deposition rate of an oxide layer and depositing a high-purity oxide layer.

However, it is difficult to generate conventional inductively coupled plasma at a low pressure (several mTorr). Thus, helicon plasma may be used, and can be generated even at a low pressure with high plasma density while using a permanent magnet. If having high-density plasma at a low pressure, a high-purity oxide layer may be formed by dissociating an injected gas (e.g., $O_2$) as much as possible. A plasma generating apparatus may deposit an oxide layer at a high pressure to adjust oxide-type (topological) characteristics after generating plasma at a low pressure to uniformly deposit a high-purity oxide layer.

Referring to FIGS. 1 to 5 and FIG. 6A to 6D, a plasma generating apparatus 100 includes a plurality of dielectric tubes 112a~112f and 212 mounted in a plurality of through-holes 111a~111f and 211 formed in a vacuum container 152, respectively; antennas 116a~116f and 216 divided into a first group of antennas 116 and a second group of antenna 216 based on their disposition symmetry in the vacuum container 152 and mounted outside the dielectric tubes 112a~112f and 212, respectively; a first RF power source 162 to supply power to the first group of antennas 116; a second RF power source 164 to supply power to the second group of antennas 216; and a first power distribution unit 122 disposed between the first group of antennas 116 and the first RF power source 162 to distribute the power from the first RF power source 162 to the first group of antennas 116.

Figure 1:
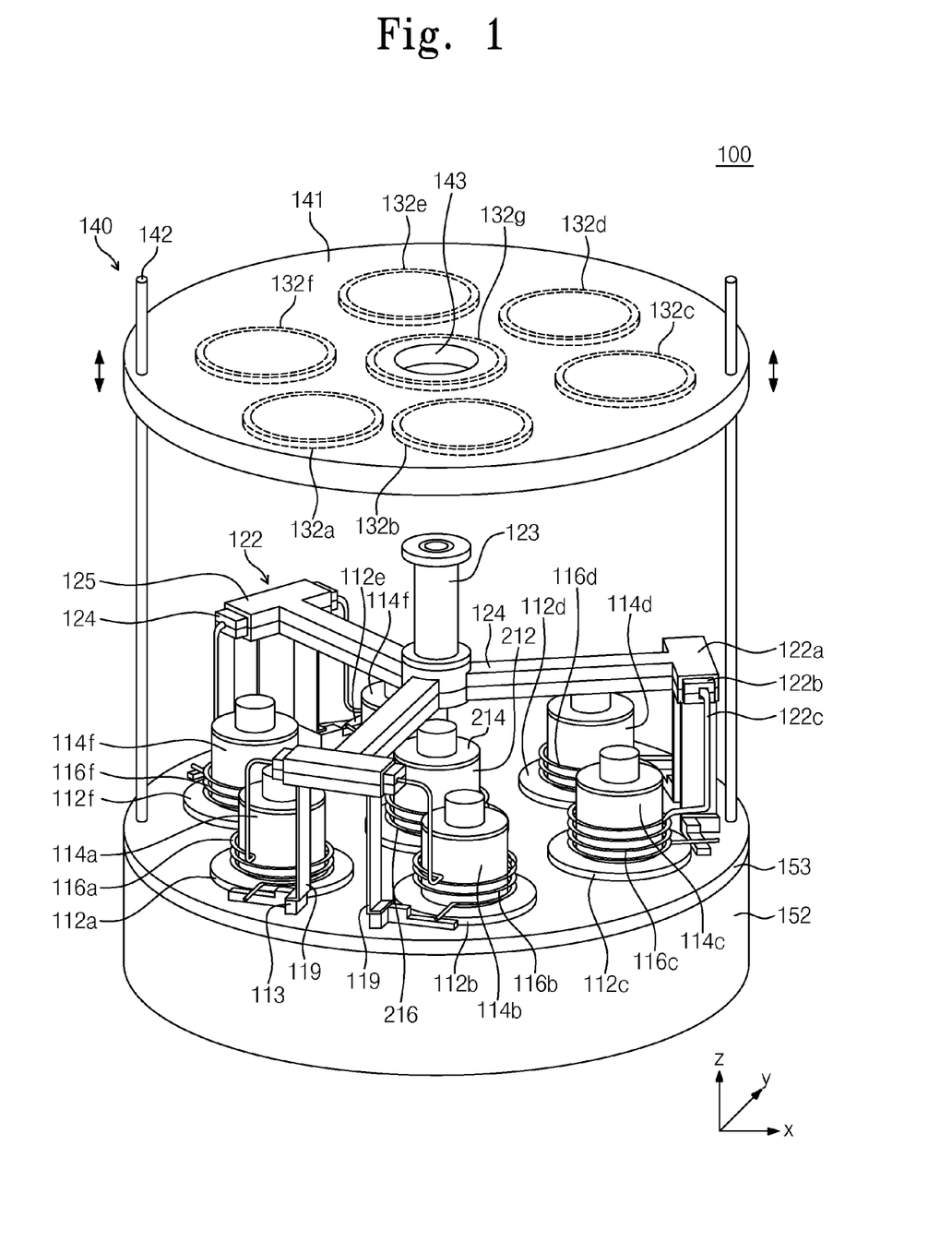
FIG. 1 is a perspective view of a plasma generating apparatus according to an embodiment of the present invention.

The vacuum container 152 may have a cylindrical shape or a square-container shape. The vacuum container 152 may include a gas supply part to supply a gas and a gas exhaust part to exhaust a gas. The vacuum container 152 may include a substrate holder 154 and a substrate 156 mounted on the substrate holder 154. The vacuum container 152 may include a top plate 153. The top plate 153 may be a lid of the vacuum container 152. The top plate 153 may be made of a metal or a metal-alloy. The top plate 153 may be disposed on an x-y plane.

Figure 2:
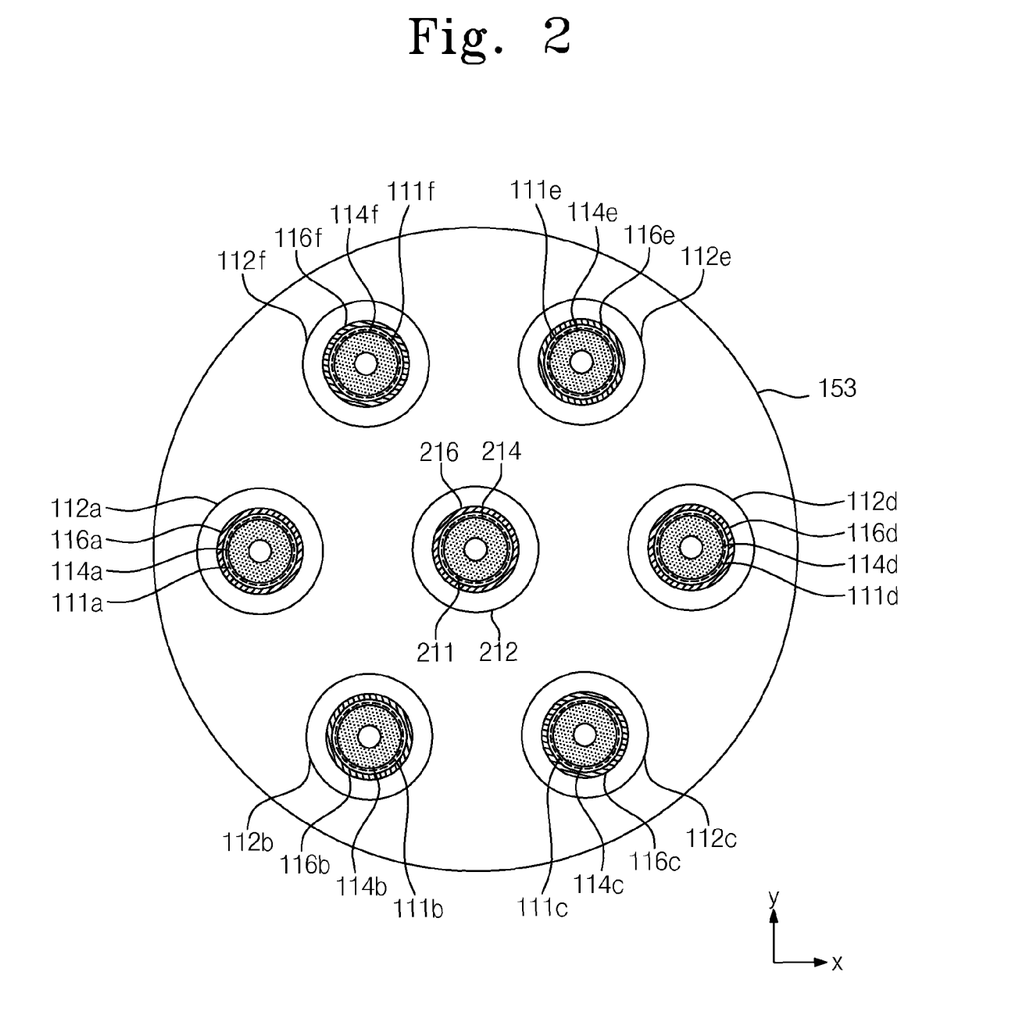
FIG. 2 is a top plan view illustrating a placement relationship of dielectric tubes in FIG. 1.

The top plate 153 may have a plurality of through-holes 111a~111f and 211. Dielectric tubes 112a~112f and 212 may be disposed on the through-holes 111a~111f and 211, respectively. A vacuum state of the dielectric tubes 112a~112f and 212 may be maintained by an O-ring disposed in the vicinity of an upper portion of the through-hole. Each of the dielectric tubes 112a~112f and 212 may be in the form of a lidless bell jar. Each of the dielectric tubes 112a~112f and 212 may include a washer-shaped support part and a cylindrical cylinder part.

Figure 5:
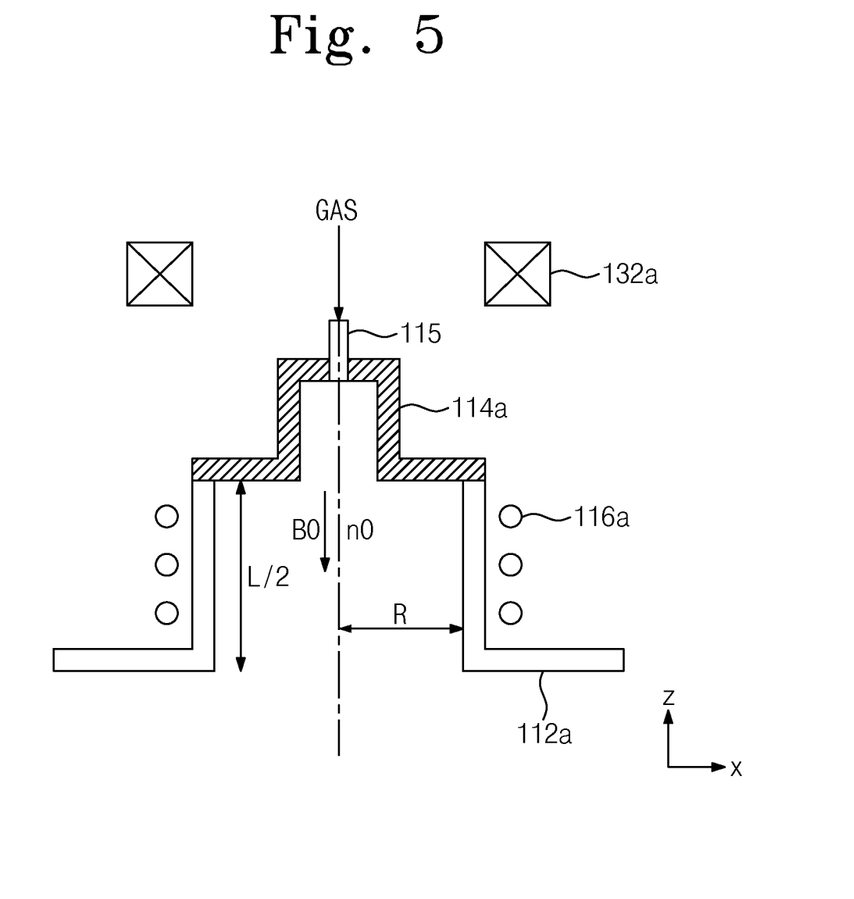
FIG. 5 illustrates the dielectric tubes in FIG. 1.

Each of the dielectric tubes 112a~112f and 212 may be made of glass, quartz, alumina, sapphire or ceramic. One end of the dielectric tubes 112a~112f and 122 may be connected to a through-hole of the vacuum container 152, and the other end thereof may be connected to metal lids 114a~114f and 214. The metal lids 114a~114f and 214 may include a gas inlet part 115 for introducing a gas. The metal lids 114a~114f and 214 may reflect a helicon wave to cause constructive interference. Each of the dielectric tubes 112a~112f and 122 may have a length of several centimeters to tens of centimeters. The length of each of the dielectric tubes 112a~112f and 122 may be determined by a radius (R) of a dielectric tube, intensity ($B_0$) of magnetic flux density, plasma density ($n_0$), and a frequency (f) of an antenna.

When the radius is R, assuming that plasma in the dielectric tube is uniform, radial current density on walls of the dielectric tubes 112a~112f and 212 for a helicon mode in which m=0 is zero. The length ($L/2=\pi/k_z$) of each of the dielectric tubes 112a~112f and 212 corresponds to a half wavelength and is given by the Equation (1) below ($k_z$ being wave number of the helicon wave).

$$k_z^4 + \left(\frac{3.83}{R}\right)^2 k_z^2 - \left(\frac{e\mu_0 n_0 \omega}{B_0}\right)^2 = 0 \quad \text{Equation (1)}$$

where e represents charge amount of electron, $B_0$ represents intensity of magnetic flux density, $\mu_0$ represents permeability, $\omega$ represents an angular frequency, and $n_0$ represents plasma density.

When the frequency f=13.56 MHz, $B_0$=90 Gauss, and $n_0=4\times10^{12}$ cm$^{-3}$, then L=11.3 cm.

The antennas 116a~116f and 216 may be divided into a first group 116 and a second group 216, based on geometric symmetry. Antennas of the first group 116 may have the same structure. Also, antennas of the second group 216 may have the same structure. Each of the antennas 116a~116f and 216 may be a cylindrical or a rectangular conductive pipe. A coolant may flow inside the antennas 116a~116f and 216.

Antennas 116a~116f of the first group 116 may be symmetrically disposed in the vicinity of a circumference of a predetermined radius on the basis of the center of the top plate 153. The first group 116 may include six antennas 116a~116f, and the second groups 216 may include only one antenna 216. Each of the antennas 116a~116f and 216 may be a three-turn antenna. The antennas 116a~116f and 216 may generate helicon plasma at a low pressure of several mTorr in combination with permanent magnets 132a~132g. When a pressure of the vacuum container 152 is tens of mTorr, inductively coupled plasma may be generated irrespective of permanent magnets.

Figure 3:
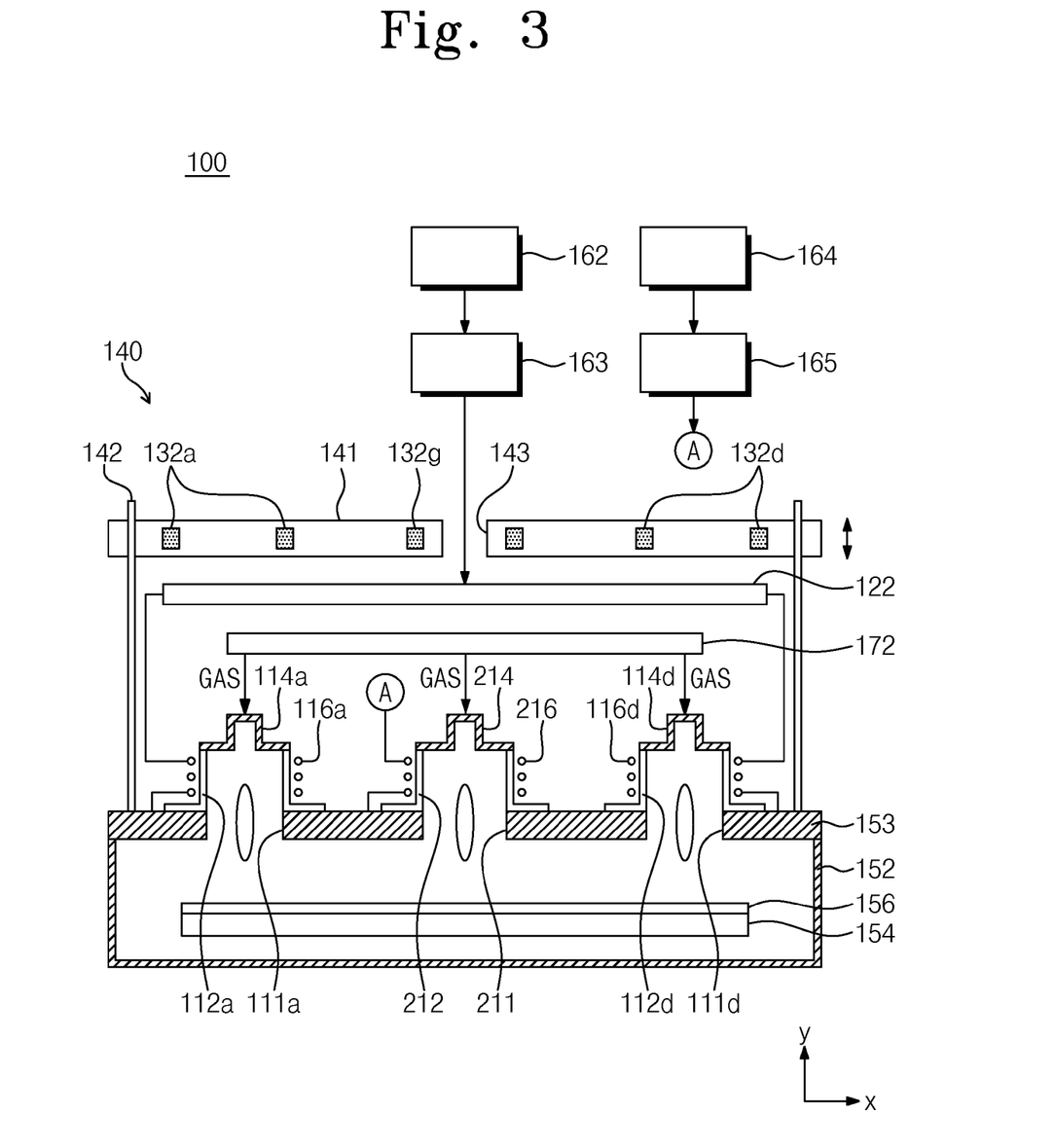
FIG. 3 is a conceptual diagram of the plasma generating apparatus in FIG. 1.
Figure 4:
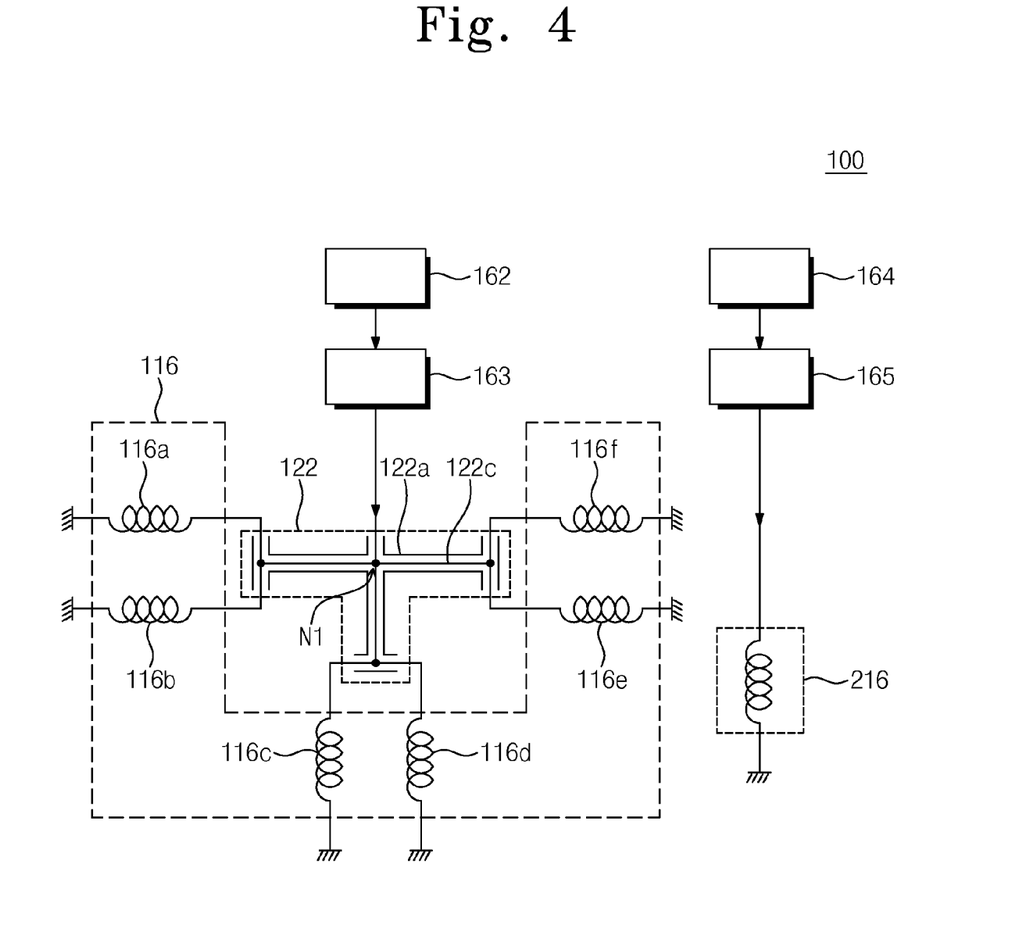
FIG. 4 is a circuit diagram of the plasma generating apparatus in FIG. 1.

The first RF power source 162 may output a sinusoidal wave of a first frequency. Power of the first RF power source 162 may be supplied to the first power distribution unit 122 through a first impedance matching network 163. A frequency of the first RF power source 162 may be from hundreds of kHz to hundreds of MHz.

Figure 6A:
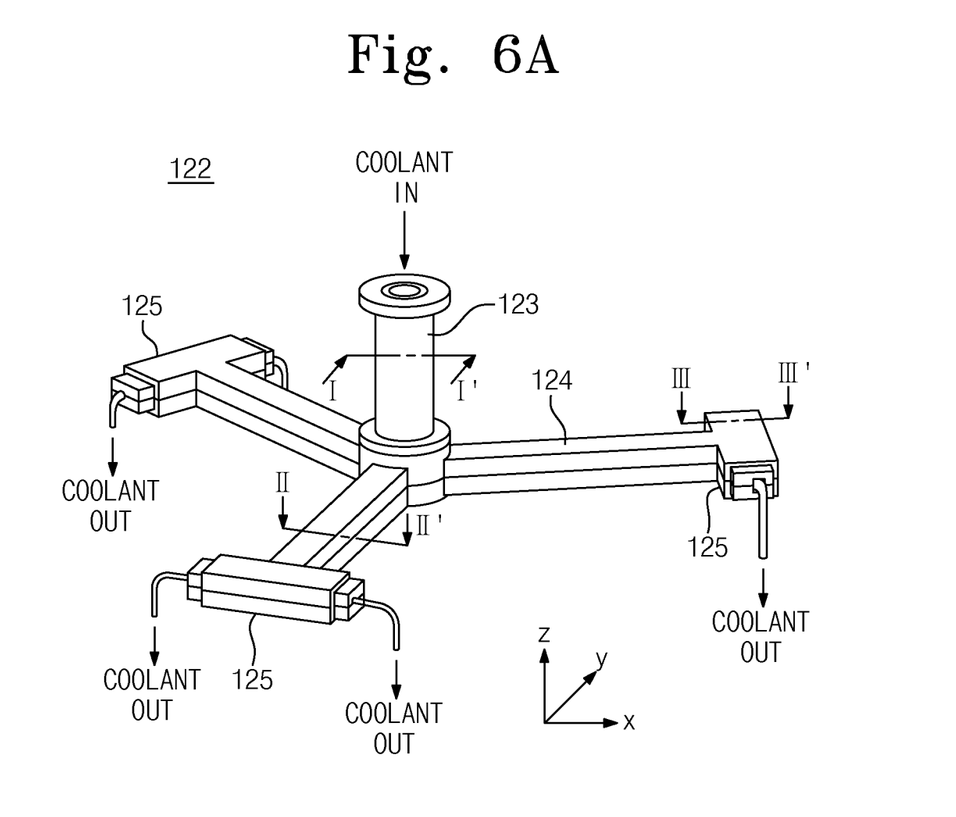
FIG. 6A is a perspective view of a power distribution unit in FIG. 1.

The first power distribution unit 122 may distribute the power received through the first impedance matching network 163 to the antennas 116a~116f of the first group 163. The first power distribution unit 122 may include a first power distribution line 122c and a first conductive outer cover 122a that covers the first power distribution line 122c and is grounded. Distances between an input terminal N1 of the first power distribution unit 122 and the antennas 116a~116f of the first group 116 may be equal to each other.

A first insulating part may be disposed between the first power distribution line 122c and the first conductive outer cover 122a.

The first power distribution unit 122 may include an input branch 123 in the form of coaxial cable to receive power from the first RF power source 162, a three-way branch 124 in the form of coaxial cable, which is connected to the input branch 123 and branches into three, and T branches 125 in the form of coaxial cable which is connected to the three-way branch 124 and branches into two.

Figure 6B:
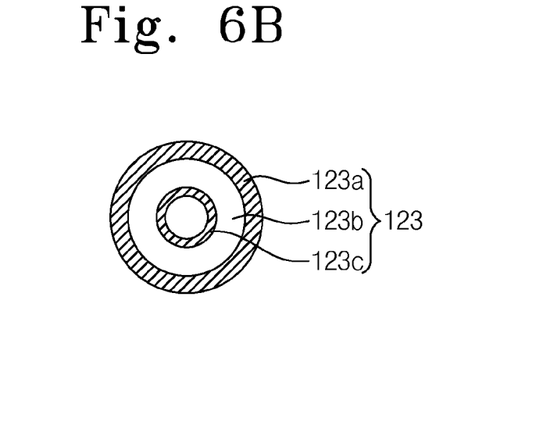
FIG. 6B is a cross-sectional view taken along a line I-I' in FIG. 6A.

The input branch 123 may be cylindrical. The input branch 123 may have a coaxial-cable structure. The input branch 123 may include a cylindrical inner conductor 123c, a cylindrical insulator 123b covering the inner conductor 123c, and a cylindrical outer conductor 123a covering the insulator 123b. A coolant may flow to the inner conductor 123c.

Figure 6C:
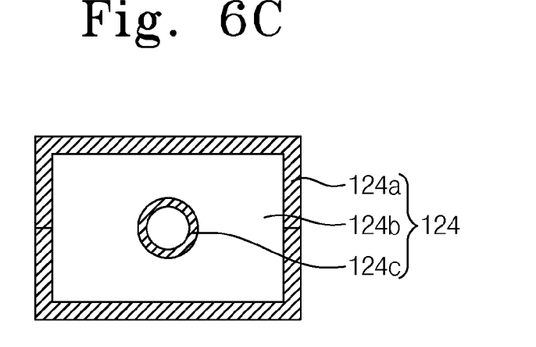
FIG. 6C is a cross-sectional view taken along a line II-II' in FIG. 6A.

One end of the input branch 123 may be connected to the first impedance matching network 163, and the other end thereof may be connected to the three-way branch 124 that branches at regular angles of 120 degrees. The three-way branch 124 may be in the form of square cylinder, which has been cut along an axis. The three-way branch 124 may be disposed on an xy plane spaced apart from the top plate 153 in a z-axis direction. The three-way branch 124 may have a coaxial-cable structure. The three-way branch 124 may include a cylindrical inner conductor 124c, a cut square-pipe insulator 124b covering the conductor 124c, and a square-pipe conductor 124a covering the insulator 124b. A coolant supplied through the inner conductor 123c of the input branch 123 may flow into the inner conductor 124c of the three-way branch 124.

Figure 6D:
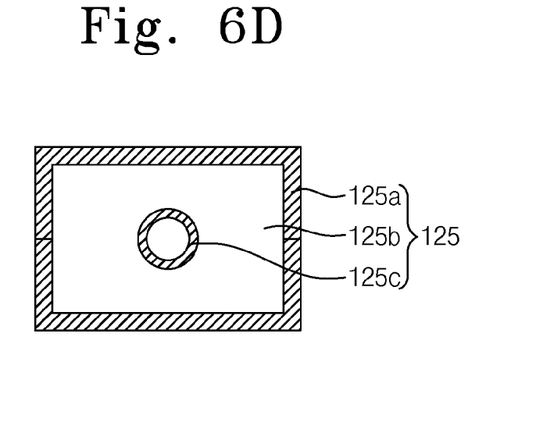
FIG. 6D is a cross-sectional view taken along a line III-III' in FIG. 6A.

The T branches 125 may be connected to the three-way branch 124 to distribute power to two branches. The T branches 125 may be in the form of cut square pipe. Each of the T branches 125 may have a coaxial-cable structure. Each of the T branches 125 may include an inner conductor 125c in the form of cylinder, an insulator 125b covering the inner conductor 125c, and an outer conductor 125a covering the insulator 125b. The coolant may flow into the inner conductor 125c. The T branches 125 may have arms with the same length.

Each of the T branches 125 may supply power to a pair of antennas (116a, 116b). The T branches 125 may have the same shape. The inner conductor 125c may be successively connected to the antennas (116a, 116b) to simultaneously supply the power and the coolant. The coolant supplied through the inner conductor 124c of the three-way branch 124 may flow into the inner conductor 125c of the T branch 125.

Fixing plates 113 may fix the antennas 116a~116f and 216 and may be fixed to the top plate 153. One end of each of the fixing plates 113 may be connected to one end of each of the antennas 116a~116f and 216 to be grounded. The other end of each of the fixing plates 113 may be connected to one end of a ground line 119 to be grounded.

The ground line 119 may connect the fixing plate 113 to the outer conductor 125a of the T branch 125. One end of the ground line 119 is connected to the other end of the fixing plate 113, and the other end of the ground line 119 may be connected to the outer conductor 125a of the T branch 125. The ground line 119 may have the same length with respect to the antennas 116a~116f of the first group 116. Thus, all the antennas 116a~116f of the first group 116 may have the same impedance.

A gas distribution unit 172 may supply a gas to dielectric tubes. The gas distribution unit 172 may have a similar structure to the first power distribution unit 122 and may equally distribute a gas to dielectric tubes. The gas distribution unit 172 may be disposed at the metal lid 214. The gas distribution unit 172 may be disposed at the metal lids 114a~114f to have the same length. More specifically, the gas distribution unit 172 may branch into three at the metal lid 214 of the second group and may branch once more in T shape to be connected to a first group of metal lids 114a~114f.

The second RF power source 164 may supply power to the antenna of the second group 216. In order to minimize interference of the first RF power source 162 and the second RF power source 164, a first frequency of the first RF power source 162 may be different from a second frequency of the second RF power source 164. For example, the first frequency may be 56 MHz, and the second frequency may be 12 MHz.

The second RF power source 164 may be directly connected to the antenna of the second group 216.

The permanent magnets 132a~132g may be in the shape of doughnut or toroid. Each of the permanent magnets 132a~132g may have a squared or circular section. A magnetization direction of the permanent magnet may be perpendicular to a plane on which the permanent magnet is disposed.

The permanent magnets 132a~132g may be inserted into a permanent magnet fixing plate 141. The permanent magnet may be disposed to be spaced apart from the center of the antenna in a z-axis direction.

A moving part 140 may be fixedly connected to the top plate 153. The moving part 140 may include at least one support pillar 142 perpendicularly extending to a plane (xy plane) on which the dielectric tubes 112a~112f and 122 are disposed. The permanent magnet fixing plate 141 may be inserted into the support pillar 142 to move along the support pillar 142. A through-hole 143 may be formed in the center of the permanent magnet fixing plate 141. The input branch 123 may be connected to the first impedance matching network 163 through the through-hole 143.

The permanent magnet fixing plate 141 may be means for fixing the permanent magnets 132a~132g. The permanent magnets 132a~132g may be disposed to be aligned with the antennas in the z-axis direction. The permanent magnets 132a~132g may be inserted into the permanent magnet fixing plate 141 to be fixed. The moving part 140 may adjust the intensity of magnetic flux density ($B_0$) in a dielectric tube to establish a helicon mode. For example, the moving part 140 may move such that a ratio ($B_0/n_0$) of plasma density ($n_0$) to magnetic flux density is constant on the give conditions (L, ω, and R). Thus, uniform plasma may be generated.

Figure 7:
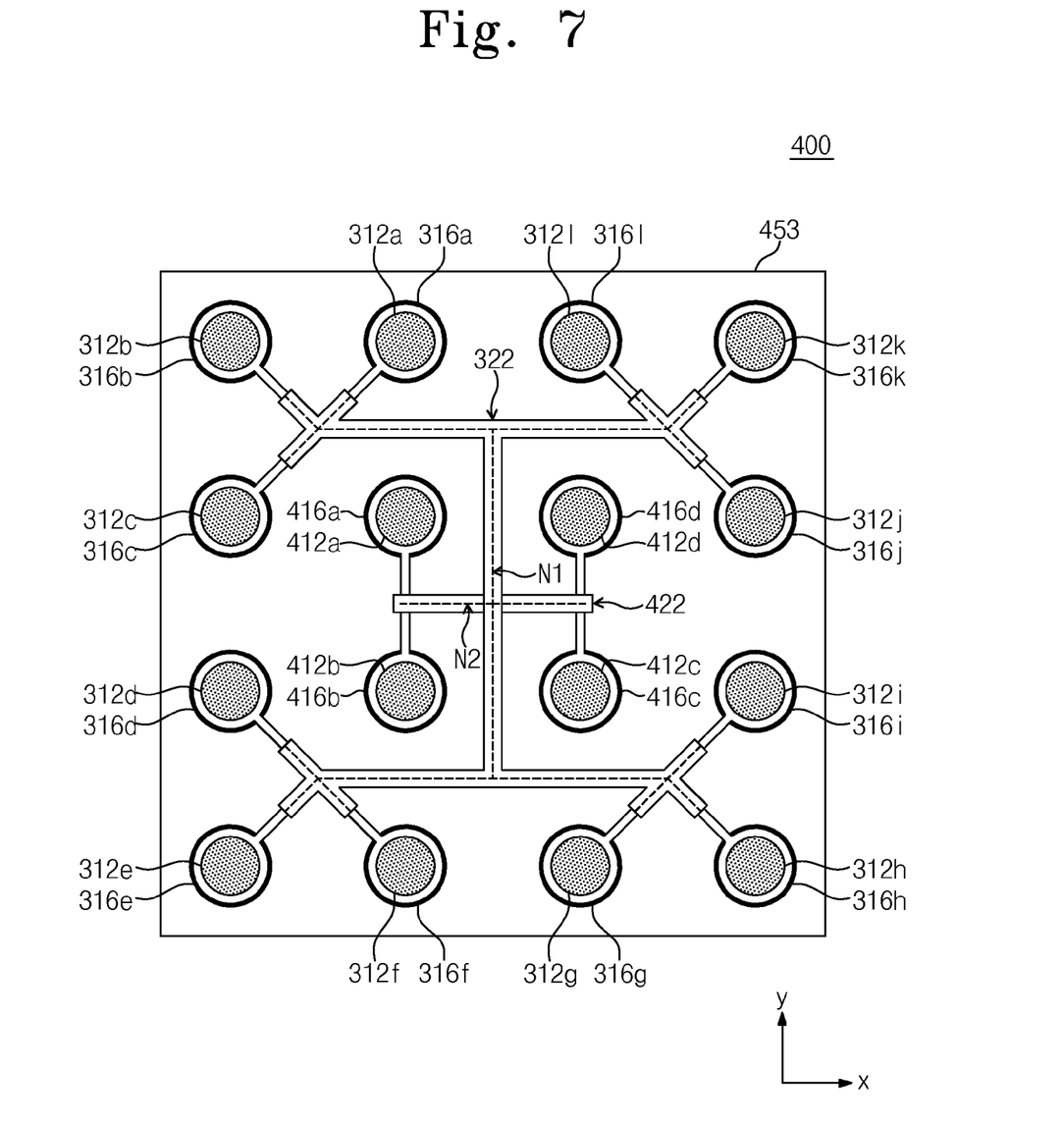
FIG. 7 is a top plan view of a plasma generating apparatus according to another embodiment of the present invention.

FIG. 7 is a top plan view of a plasma generating apparatus according to another embodiment of the present invention.

Figure 8:
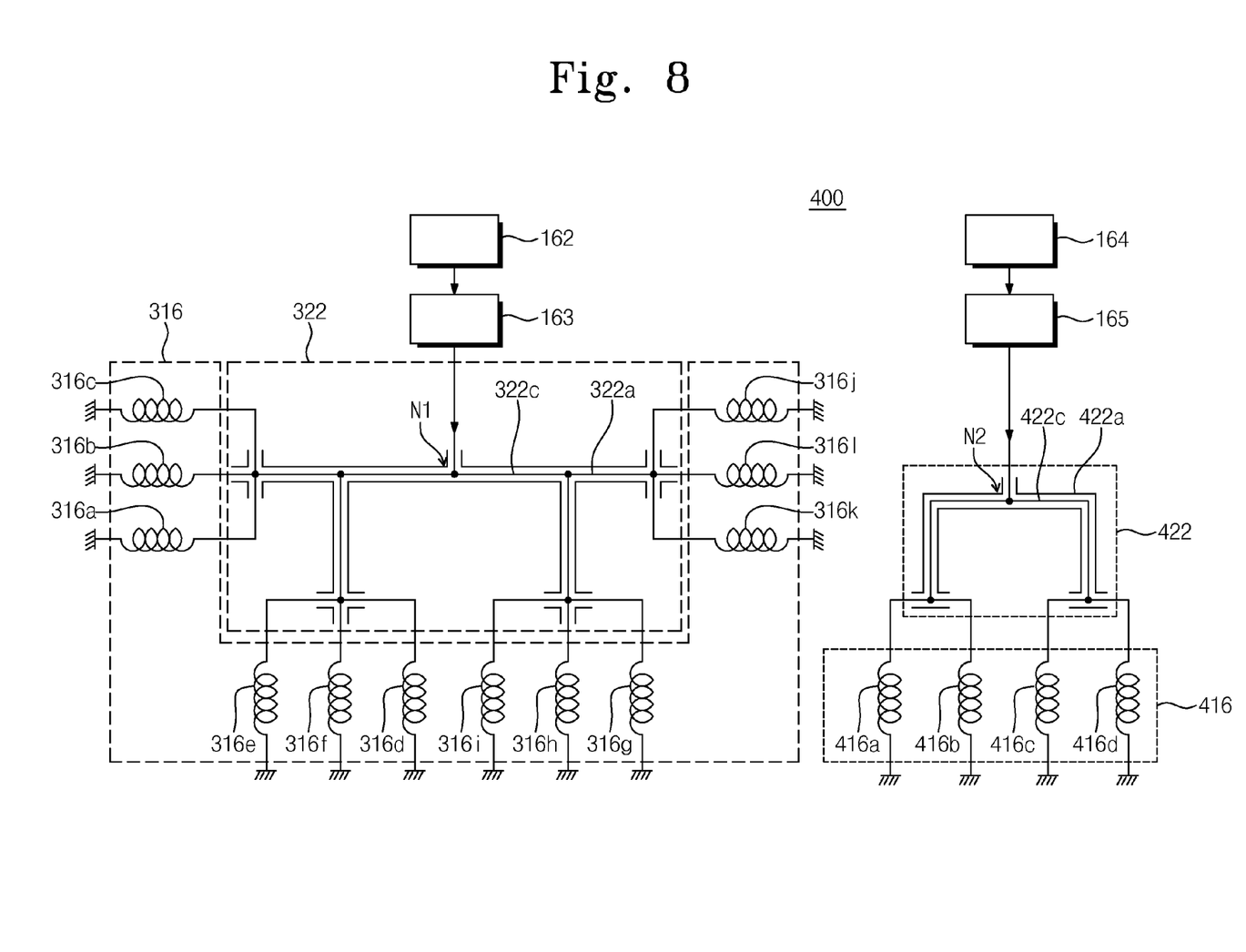
FIG. 8 is a circuit diagram of the plasma generating apparatus in FIG. 7.

FIG. 8 is a circuit diagram of the plasma generating apparatus in FIG. 7.

Referring to FIGS. 7 and 8, a plasma generating apparatus 400 includes a plurality of dielectric tubes 312a~312l and 412a~412d mounted in a plurality of through-holes formed at a vacuum container 453, respectively; antennas 316a~316l and 416a~416d divided into a first group and a second group based on their disposition symmetry in the vacuum container 453 and mounted outside the dielectric tubes 312a~312l and 412a~412d, respectively; a first RF power source 162 to supply power to an antenna of the second first group 316; a second RF power source 164 to supply power to an antenna of the second group 416; and a first power distribution unit 322 disposed between the antenna of the first group 316 and the first RF power source 162 to distribute the power from the first RF power source 162 to the antenna of the first group 316.

The antennas 316a~316l and 416a~416d may be arranged on a squared top plate of the vacuum container 453 in a matrix of 4×4. The antenna of the first group 316 may be disposed along the circumference. The antenna of the second group 416 may be disposed inside to be surrounded by the antenna of the first group 316.

The first power distribution unit 322 may include a first power distribution line 322c and a first conductive outer cover 322a that covers the first power distribution line 322c and is grounded. A distance between an input terminal N1 of the first power distribution unit 322 and the antenna of the first group 316 may be the same.

The second power distribution unit 422 may be disposed between the second RF power source 164 and the antenna of the second group 416. The second power distribution unit 422 may include a second power distribution line 422c and a second conductive outer cover 422a that covers the second power distribution line 422c and is grounded. A distance between an input terminal N2 of the second power distribution unit 422 and the antenna of the second group 416 may be the same.

The antennas 316a~316l and 416a~416d may be grounded to the vacuum container 453 through a ground line.

A permanent magnet may be disposed on the antennas 316a~316l and 416a~416d. A moving part may adjust a distance between the permanent magnet and the antennas 316a~316l and 416a~416d.

Figure 9:
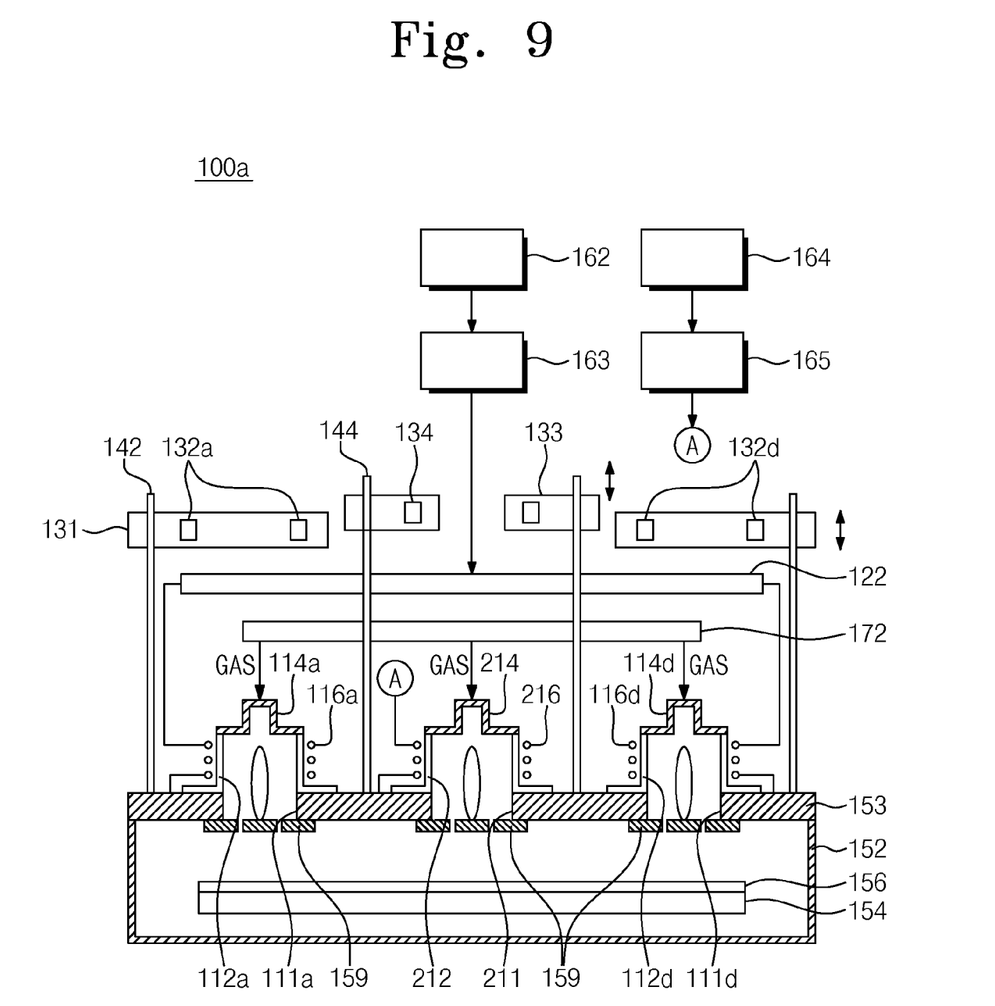
FIG. 9 illustrates a plasma generating apparatus according to another embodiment of the present invention.

FIG. 9 illustrates a plasma generating apparatus according to another embodiment of the present invention. In FIG. 9, sections different from FIG. 1 will be extensively described to avoid duplicate description.

Referring to FIG. 9, a plasma generating apparatus 100a may include a plurality of dielectric tubes 112a~112f and 212 mounted in a plurality of through-holes 111a~111f and 211 formed at a vacuum container 152, respectively; antennas 116a~116f and 216 divided into a first group 116 and a second group 216 and mounted outside the dielectric tubes 112a~112f and 212; a first RF power source 162 to supply power to an antenna of the first group 116; a second RF power source 164 to supply power to an antenna of the second group 216; and a first power distribution unit 122 disposed between the antenna of the first group 116 and the first RF power source 162 to distribute the power from the first RF power source 162 to the antenna of the first group 116.

The gas distribution unit 172 may supply a gas to the dielectric tubes 112a~112f and 212. The gas distribution unit 172 may be disposed at a metal lid 214. The gas distribution unit 172 may be formed to have the same length with respect to the dielectric tubes 112a~112f inside which the antennas 116a~116f of the first group 116 are disposed.

Permanent magnets may be divided into a permanent magnet of a first group corresponding to an antenna of the first group 116 and a permanent magnet of a second group corresponding to an antenna of the second group 216. A moving part may include a first moving part and a second moving part. The first moving part may include a first support pillar and a first permanent magnet fixing plate to fix the permanent magnet of the first group. The first permanent magnet fixing plate may move along the first support pillar in a z-axis direction. The second moving part may include a second support pillar and a second permanent magnet fixing plate to fix the permanent magnet of the second group. The permanent magnet fixing plate may move along the second support pillar in the z-axis direction.

Grids 159 may be disposed at lower portions of the through-hoes, respectively. Each of the grids may be made of a conductive material. Accordingly, plasma discharged inside a dielectric tube may be limited to the inside of the dielectric tube. As a result, a substrate may be processed without direct exposure to the plasma.

As described so far, a plasma generating apparatus according to an embodiment of the present invention can spatially uniformly generate helicon plasma.

Although the present invention has been described in connection with the embodiment of the present invention illustrated in the accompanying drawings, it is not limited thereto. It will be apparent to those skilled in the art that various substitutions, modifications and changes may be made without departing from the scope and spirit of the present invention.

What is claimed is:

1. A plasma generating apparatus comprising:
a plurality of dielectric tubes mounted in a plurality of through-holes formed in a vacuum container, respectively;
antennas comprising a first antenna group having one or more antennas and a second antenna group having one or more antennas based on a disposition symmetry of the antennas in the vacuum container, wherein:
  each of the one or more antennas of the first antenna group and the second antenna group are mounted outside a respective one of the dielectric tubes,
  the one or more antennas of the first antenna group are symmetrically disposed in a vicinity of a circumference of a constant radius on a basis of a center of a circular top plate of the vacuum container, and
  the one or more antennas of the second antenna group are disposed substantially in the center of the circular top plate;
a first RF power source to supply power to the first antenna group;
a second RF power source to supply power to the second antenna group; and
a first power distribution unit disposed between the first antenna group and the first RF power source to distribute the power from the first RF power source to the first antenna group, the first power distribution unit comprising:
  an input branch in a form of coaxial cable which receives power from the first RF power source,
  a three-way branch in the form of coaxial cable which is connected to the input branch and branches in three directions; and
  T branches in the form of coaxial cable which is connected to the three-way branch and which further branches in two.

2. The plasma generating apparatus of claim 1, wherein the first power distribution unit comprises:
a first power distribution line; and
a first conductive outer cover that covers the first power distribution line and is grounded,
wherein a distance between an input terminal of the first power distribution unit and the first antenna group is a same.

3. The plasma generating apparatus of claim 1, comprising toroidal permanent magnets disposed in a spaced arrangement along a longitudinal direction of the dielectric tubes.

4. The plasma generating apparatus of claim 3, comprising a moving part to fix all or some of the permanent magnets and to move a plane on which the permanent magnets are disposed.

5. The plasma generating apparatus of claim 4, wherein the moving part comprises:
at least one support pillar fixedly connected to the vacuum container and perpendicularly extending to a plane on which the dielectric tubes are disposed; and
a permanent magnet fixing plate, on which the permanent magnets are mounted, inserted into the support pillar to be movable along the support pillar.

6. The plasma generating apparatus of claim 1, comprising:
fixing plates for fixing the antennas and which are fixed to the top plate; and
a ground line connected to the fixing plates and an outer conductor of the T branches,
wherein one end of each of the fixing plates is connected to one end of each of the antennas, and a second end of the fixing plates is connected to one end of the ground line, and
wherein a length of the ground line is a same with respect to all of the antennas.

7. The plasma generating apparatus of claim 1, comprising:
metal lids, each being mounted on one end of each of the dielectric tubes,
wherein a length ($L/2=\pi/k_z$) of each of the dielectric tubes meets a following equation:

$$k_z^4 + \left(\frac{3.83}{R}\right)^2 k_z^2 - \left(\frac{e\mu_0 n_0 \omega}{B_0}\right)^2 = 0$$

where R represents a radius of each of the dielectric tubes, e represents a charge amount of electron, $B_0$ represents an intensity of magnetic flux density in a center of each of the dielectric tubes, $\mu_0$ represents a permeability, $\omega$ represents an angular frequency, and $n_0$ represents a plasma density.

8. A plasma generating apparatus comprising:
a plurality of dielectric tubes mounted in a plurality of through-holes formed at a vacuum container, respectively;
antennas comprising a first antenna group and a second antenna group based on a disposition symmetry of the antennas in the vacuum container, the antennas being mounted outside the dielectric tubes, respectively;
a first RE power source to supply power to the first antenna group;
a second RE power source to supply power to the second antenna group;
a first power distribution unit disposed between the first antenna group and the first RE power source to distribute the power from the first RF power source to the first antenna group; and
grids disposed at lower portions of the through-holes; respectively.

9. A plasma generating apparatus comprising:
a plurality of dielectric tubes mounted in a plurality of through-holes formed in a vacuum container, respectively;
antennas comprising a first antenna group having one or more antennas and a second antenna group having one or more antennas based on a disposition symmetry of the antennas in the vacuum container, the antennas being mounted outside the dielectric tubes, respectively;

a first RF power source to supply power to the first antenna group;

a second RF power source to supply power to the second antenna group; and a first power distribution unit disposed between the first antenna group and the first RF power source to distribute the power from the first RF power source to the first antenna group, wherein a driving frequency of the first RF power source is different from a driving frequency of the second RF power source.

10. The plasma generating apparatus of claim 9, comprising a second power distribution unit disposed between the second antenna group and the second RF power source to distribute power from the second RF power source to the second antenna group.

* * * * *

UNITED STATES PATENT AND TRADEMARK OFFICE
CERTIFICATE OF CORRECTION

PATENT NO. : 9,734,990 B2
APPLICATION NO. : 14/251013
DATED : August 15, 2017
INVENTOR(S) : Hong-Young Chang et al.

It is certified that error appears in the above-identified patent and that said Letters Patent is hereby corrected as shown below:

In the Claims

At Column 10, Line 51 Claim 14 replace "RE" with --RF--.

At Column 10, Line 53 Claim 14 replace "RE" with --RF--.

At Column 10, Line 56 Claim 14 replace "RE" with --RF--.

Signed and Sealed this
Seventh Day of November, 2017

Joseph Matal
*Performing the Functions and Duties of the*
*Under Secretary of Commerce for Intellectual Property and*
*Director of the United States Patent and Trademark Office*